(12) United States Patent
Chang et al.

(10) Patent No.: US 8,980,065 B2
(45) Date of Patent: Mar. 17, 2015

(54) METHOD OF MAKING COATED ARTICLES

(71) Applicants: Hong Fu Jin Precision Industry (ShenZhen) Co., Ltd., Shenzhen (CN); Hon Hai Precision Industry Co., Ltd., New Taipei (TW)

(72) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Jia Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 201 days.

(21) Appl. No.: 13/783,576

(22) Filed: Mar. 4, 2013

(65) Prior Publication Data
US 2013/0175159 A1    Jul. 11, 2013

Related U.S. Application Data

(63) Continuation-in-part of application No. 13/154,589, filed on Jun. 7, 2011, now Pat. No. 8,377,568.

(30) Foreign Application Priority Data

Sep. 15, 2010  (CN) .......................... 2010 1 0282317

(51) Int. Cl.
| | | |
|---|---|---|
| *C23C 14/00* | (2006.01) | |
| *C23C 14/32* | (2006.01) | |
| *C23C 14/35* | (2006.01) | |
| *C23C 28/00* | (2006.01) | |
| *C23C 14/16* | (2006.01) | |
| *C23C 14/18* | (2006.01) | |
| *C23C 14/58* | (2006.01) | |

(52) U.S. Cl.
CPC ............... *C23C 14/35* (2013.01); *C23C 28/322* (2013.01); *C23C 28/345* (2013.01); *C23C 14/165* (2013.01); *C23C 14/185* (2013.01); *C23C 14/5853* (2013.01)
USPC ................................... 204/192.1; 204/192.15

(58) Field of Classification Search
CPC   C23C 14/165; C23C 28/345; C23C 14/5853; C23C 14/185
USPC .......................................... 204/192.1, 192.15
See application file for complete search history.

*Primary Examiner* — Keith Hendricks
*Assistant Examiner* — Ibrahime A Abraham
(74) *Attorney, Agent, or Firm* — Novak Druce Connolly Bove + Quigg LLP

(57) ABSTRACT

A method of making a coated article includes providing a substrate; forming a nickel layer on the substrate by magnetron sputtering; forming a titanium layer on the nickel layer by magnetron sputtering; and applying a thermal oxidative treatment to the nickel and titanium layered substrate to form a catalyst layer and a self-cleaning layer. The self-cleaning layer includes metallic titanium, metallic nickel, nickel oxide and titanium dioxide.

9 Claims, 3 Drawing Sheets

METHOD OF MAKING COATED ARTICLES

CROSS-REFERENCE TO RELATED APPLICATION

This application is a continuation in part application of U.S. Ser. No. 13/154,589, filed Jun. 7, 2011 the contents of which are hereby incorporated by reference. The patent application Ser. No. 13/154,589 in turn claims the benefit of priority under 35 USC 119 from Chinese Patent Application 201010282317.0, filed on Sep. 15, 2010. This application is related to U.S. Patent Application (U.S. Ser. No. 13/154,589, pending), entitled "COATED ARTICLE". Such application has the same assignee as the present application. The above-identified application is incorporated herein by reference.

BACKGROUND

Technical Field

This disclosure relates to a method of making a coated article with a self-cleaning layer.

Titanium oxide is a photocatalytic material, which can be used to achieve photocatalytic oxidation. That is to say, titanium oxide is self-cleaning. Mixing metal or non metal into titanium oxide is a conventional method to improve the photocatalytic activity of the titanium oxide. However, the process of this method is complex and costly.

Therefore, there is room for improvement within the art.

BRIEF DESCRIPTION OF THE DRAWINGS

Many aspects of the coated article and method of making the same can be better understood with reference to the following drawings. The components in the drawings are not necessarily drawn to scale, the emphasis instead being placed upon clearly illustrating the principles of the coated article and method of making the same.

DETAILED DESCRIPTION

Figure 1:
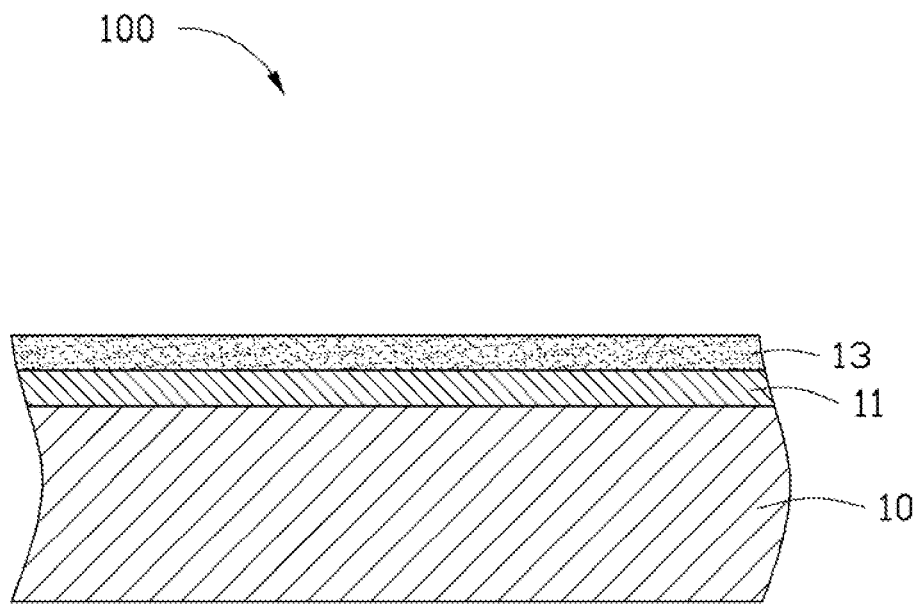
FIG. 1 is a schematic view of a coated article including a catalyst layer and a self-cleaning layer, in accordance with an exemplary embodiment.

FIG. 1 shows an exemplary embodiment of a coated article 100. The coated article 100 includes a catalyst layer 11 and a self-cleaning layer 13 formed on a substrate 10 in that order. Each of the layers 11, 13 has a thickness in a range of 0.5 μm to 1.0 μm.

The substrate 10 may be made of metal, e.g., stainless steel, aluminum, or non-metal, e.g., ceramics, glass. The catalyst layer 11 is made of nickel. The self-cleaning layer 13 includes titanium, nickel, nickel oxide, and titanium dioxide.

Figure 2:
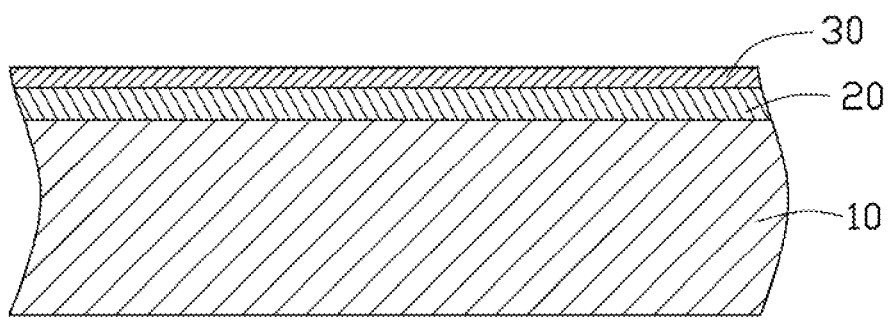
FIG. 2 is a schematic view of a coated article including a nickel layer and a titanium layer.
Figure 3:
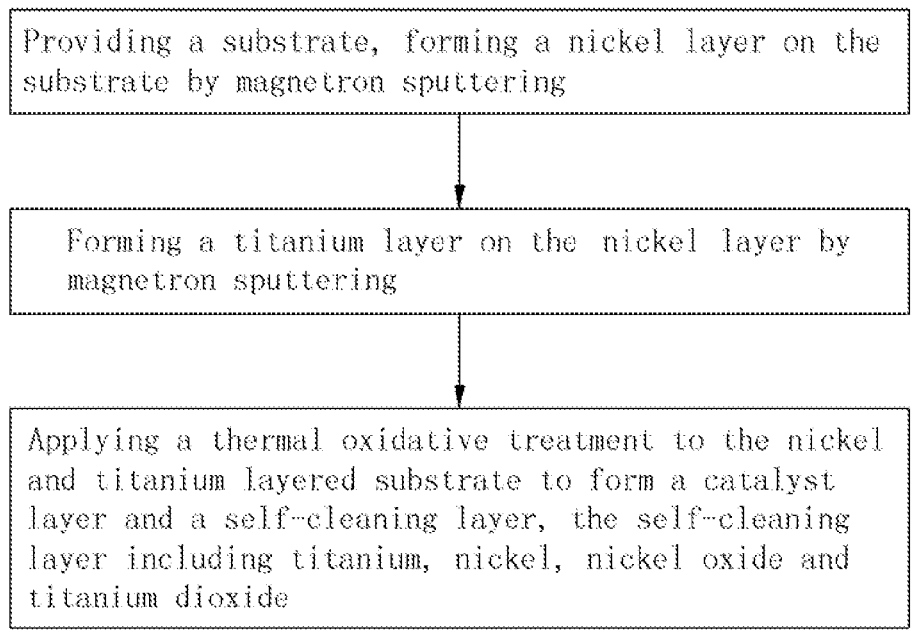
FIG. 3 is a flow chart of making the coated article shown in FIG. 1.

Referring to FIG. 2 and FIG. 3, a method of making the coated article 100 includes the following steps:

A substrate 10 is provided. The substrate 10 may be a metal, e.g., stainless steel, aluminum, or a non-metal, e.g., ceramics, glass.

A surface pre-treatment is applied to the substrate 10. The pre-treatment includes oil cleaning by chemical method, paraffin removal, acid cleaning, cleaning by ultrasound and drying.

The substrate 10 is cleaned by plasma. This process can remove any remaining oil on the substrate 10, which can increase a bonding force between the substrate 10 and the following layer formed on the substrate 10. In this process, the substrate 10 is set in a vacuum chamber (not shown) of a vacuum sputtering coating machine (not shown). Air in the vacuum chamber is pumped out until the pressure in the vacuum chamber is about $8 \times 10^{-3}$ pascals (Pa). Argon gas is input to the chamber at a flow rate in a range of 50 sccm to 400 sccm. The purity of the argon gas is 99.9999%. A bias voltage in a range of −300 V to −600 V is applied to the substrate 10, and the substrate 10 is then cleaned with plasma. The time of this cleaning process is in a range of 5 minutes (min) to 10 min.

A nickel layer 20 is formed on the substrate 10 by magnetron sputtering. A nickel target is placed in the vacuum chamber and is electrically connected to a power source. Pressure in the vacuum chamber is in a range of $4 \times 10^{-3}$ Pa to $5.3 \times 10^{-3}$ Pa. Argon gas as a working gas is input to the chamber at a flow rate in a range of 300 sccm to 500 sccm. The power source connected to the nickel target is activated and a bias voltage in a range of −100V to −200V is applied to the nickel target. A nickel layer 20 is deposited on the surfaces of the substrate 10. Magnetron sputtering the nickel layer 20 is conducted at a temperature in a range of about 50° C. to about 100° C. The time of this depositing process is in a range of 5 min to 10 min. The power source connected to the nickel target is closed after the depositing process.

A titanium layer 30 is formed on the nickel layer by magnetron sputtering. A titanium target is provided in the vacuum chamber and is connected to a power source. Pressure in the vacuum chamber is about $4 \times 10^{-3}$ Pa to $5.3 \times 10^{-3}$ Pa. Argon gas is input to the chamber at a flow rate in a range of 300 sccm to 500 sccm. The power source connected to the titanium target is activated and a bias voltage in a range of −150 V to −200 V is applied to the titanium target. The titanium layer 30 is deposited on the nickel layer 20. Magnetron sputtering the titanium layer is conducted at a temperature in a range of about 120° C. to about 200° C. The time of this depositing process is in a range of about 5 min to about 10 min. The power source connected to the titanium target is closed after the depositing process.

A thermal oxidative treatment is applied to the nickel and titanium layered substrate. In this process, the layered substrate 10 is placed in an air chamber containing less than 2% oxygen by volume but greater than 0%. The layered substrate 10 is heated to a temperature of about 400° C. to 700° C. at a speed of about 15° C./min to 30° C./min, and the temperature is maintained for 40 min to 90 min. The nickel of the nickel layer 20 and the titanium of the titanium layer 30 partially oxidize, forming the self-cleaning layer 13, which includes titanium, nickel, nickel oxide, and titanium dioxide. The portion of the nickel layer 20 without oxidation forms the catalyst layer 11.

The principle of forming the self-cleaning layer 13 is described as follows. The melting point of nickel is lower than titanium. During the oxidation process, the oxygen molecules penetrate the titanium layer via the interstices of the titanium atoms and act with the nickel atoms to form nickel oxide. The nickel oxide forms nanoneedle or nanorod structures, promoting oxidation of the titanium in the titanium layer.

The self-cleaning layer 13 formed by the above method has a micron-nano mastoid structure on the substrate 10, which increases surface area of the self-cleaning layer 13. This improves the photocatalytic activity of the self-cleaning layer 13 and the article coated with the self-cleaning layer 13 has a good self-cleaning function.

It is to be understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method of making a coated article, comprising steps of:
   providing a substrate;
   forming a nickel layer on the substrate by magnetron sputtering;
   forming a titanium layer on the nickel layer by magnetron sputtering; and
   applying a thermal oxidative treatment to the nickel and titanium layered substrate to form a catalyst layer and a self-cleaning layer, the self-cleaning layer including metallic titanium, metallic nickel, nickel oxide and titanium dioxide.

2. The method as claimed in claim 1, wherein in the step of applying thermal oxidative treatment, the metallic nickel in the nickel layer and the metallic titanium in the titanium layer partially oxidize, forming the self-cleaning layer; and the remainder of the non-oxidized nickel layer forms the catalyst layer.

3. The method as claimed in claim 2, wherein in the step of thermal oxidative treatment, the substrate with the nickel layer and the titanium layer is heated to reach a temperature in a range of 400° C. to 700° C. at a speed in a range of 15° C./min to 30° C./min, and the temperature is maintained for 40 min to 90 min.

4. The method as claimed in claim 3, wherein during the thermal oxidative treatment, the substrate with the nickel layer and the titanium layer is placed in a air chamber containing less than 2% oxygen by volume but greater than 0%.

5. The method as claimed in claim 1, wherein in the step of forming the nickel layer, a nickel target is provided and a bias voltage in a range of −100 V to −200 V is applied to the nickel target; argon gas is provided as a working gas having a flow rate in a range of 300 sccm to 500 sccm; and forming the nickel layer is conducted at a temperature in a range of about 50° C. to about 100° C.

6. The method as claimed in claim 5, wherein forming the nickel layer takes about 5 min to about 10 min.

7. The method as claimed in claim 1, wherein in the step of forming the titanium layer, a titanium target is provided and a bias voltage in a range of −150 V to −200 V is applied to the titanium target; argon gas is provided as a working gas having a flow rate in a range of 300 sccm to 500 sccm; nitrogen gas is provided as an active gas having a flow in a range of about 100 sccm to about 200 sccm; and forming the titanium layer is conducted at a temperature in a range of about 120° C. to about 200° C.

8. The method as claimed in claim 7, wherein forming the titanium layer takes about 5 min to about 10 min.

9. The method as claimed in claim 1, wherein the substrate is made of a material selected from the group consisting of metal, ceramic, and glass.

* * * * *